United States Patent
Hojabri et al.

(10) Patent No.: US 8,766,835 B2
(45) Date of Patent: Jul. 1, 2014

(54) SIGMA DELTA ADC WITH CURRENT MODE MIXER INPUT

(75) Inventors: Peyman Hojabri, San Jose, CA (US); Dongwei Chen, Fremont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 13/400,312

(22) Filed: Feb. 20, 2012

(65) Prior Publication Data
US 2013/0214950 A1 Aug. 22, 2013

(51) Int. Cl.
*H03M 3/00* (2006.01)
(52) U.S. Cl.
CPC .............. *H03M 3/458* (2013.01); *H03M 3/30* (2013.01)
USPC .......................................... 341/143; 341/155
(58) Field of Classification Search
CPC ........ H03M 3/458; H03M 3/478; H03M 3/30
USPC .......................................... 341/143, 144, 155
See application file for complete search history.

(56) References Cited

U.S. PATENT DOCUMENTS

| | | | | |
|---|---|---|---|---|
| 5,886,659 | A * | 3/1999 | Pain et al. .................... | 341/155 |
| 6,040,731 | A * | 3/2000 | Chen et al. .................... | 327/359 |
| 6,847,319 | B1 | 1/2005 | Stockstad | |
| 7,436,338 | B2 * | 10/2008 | Hales et al. .................... | 341/143 |
| 7,469,137 | B2 | 12/2008 | Jensen | |
| 7,835,706 | B2 * | 11/2010 | Welland et al. ................. | 455/76 |
| 2005/0057382 | A1 | 3/2005 | Chen | |
| 2007/0139241 | A1 | 6/2007 | Hales et al. | |
| 2008/0278360 | A1 | 11/2008 | Koli | |

* cited by examiner

*Primary Examiner* — Brian Young
(74) *Attorney, Agent, or Firm* — Andrew Viger; Frederick J. Telecky, Jr.

(57) ABSTRACT

Continuous time sigma delta (ΣΔ) analog-to-digital conversion (ADC) circuitry and method in which current mode ΣΔ ADC circuitry is driven directly by current mode mixing circuitry, thereby avoiding a need for a current-to-voltage driver between the input signal mixing circuitry and ΣΔ ADC circuitry.

17 Claims, 3 Drawing Sheets

US 8,766,835 B2

SIGMA DELTA ADC WITH CURRENT MODE MIXER INPUT

BACKGROUND

The present invention relates to analog-to-digital conversion (ADC) circuitry, and in particular, to continuous time sigma delta ADC circuitry.

As signal conversion and processing rates have increased dramatically within today's digital systems, conversion rates for analog signals to digital signals have increased dramatically. To achieve the necessary conversion rates, sigma delta ADC circuits are often used, with one example being a continuous time sigma delta ADC circuit.

Referring to FIG. 1, a conventional continuous time sigma delta ADC circuit 10 includes mixer circuitry 12, and the continuous time sigma delta ADC circuit 16, between which a voltage-to-current conversion circuit 14 (e.g., buffer and/or filter circuitry) is used. As is well known in the art, the mixer circuitry 12 mixes the incoming analog signal 11$i$ with a local oscillator, or clock, signal 11$c$ (e.g., as part of a quadrature signal conversion). The mixer circuitry 12 is generally operated in such a manner as to convert the input current signals 11$i$, 11$c$ to a voltage mode signal as the resulting mixed, or product, signal 13.

However, conventional continuous time sigma delta ADC circuits 16 operate with A current mode input stage. Accordingly, the voltage mode mixed signal 13 must be converted to a current mode signal 15. This is achieved by the voltage-to-current conversion circuit 14, in accordance with principles well known in the art.

A problem associated with this type of implementation is the overhead, e.g., in terms of circuit elements and power requirement/dissipation, associated with the current-to-voltage conversion of the mixer circuitry 12 and the voltage-to-current conversion circuitry 14 necessary to ultimately provide a current mode signal 15 for the sigma delta ADC circuitry 16, even though the original input signals 11$i$, 11$c$ were already current mode signals. Accordingly, it would be desirable to minimize or even avoid such overhead.

SUMMARY

In accordance with the presently claimed invention, continuous time sigma delta ($\Sigma\Delta$) analog-to-digital conversion (ADC) circuitry and a method for continuous time $\Sigma\Delta$ analog-to-digital signal conversion are provided in which current mode $\Sigma\Delta$ ADC circuitry is driven directly by current mode mixing circuitry, thereby avoiding a need for a current-to-voltage driver between the input signal mixing circuitry and $\Sigma\Delta$ ADC circuitry.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, to the extent that the figures illustrate diagrams of the functional blocks of various embodiments, the functional blocks are not necessarily indicative of the division between hardware circuitry. Thus, for example, one or more of the functional blocks may be implemented in a single piece of hardware.

Figure 1:
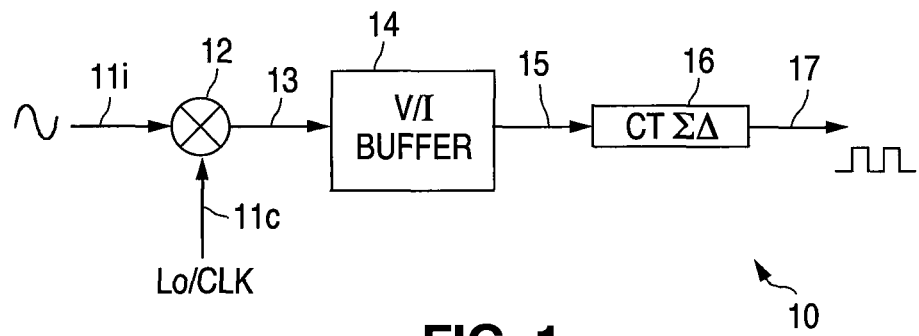
FIG. 1 is a functional blocked diagram of a conventional continuous time $\Sigma\Delta$ ADC circuit.
Figure 2:
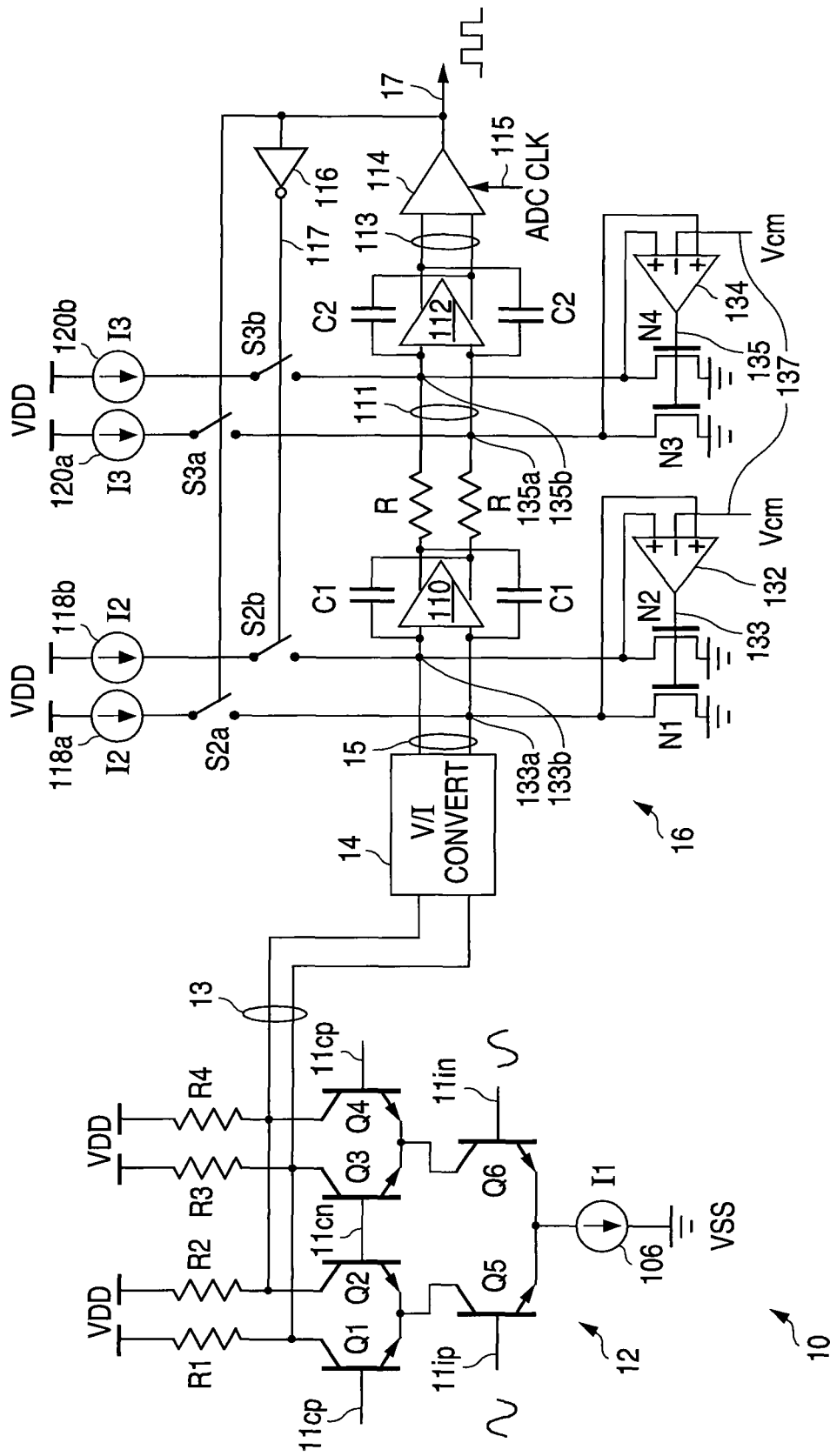
FIG. 2 is a schematic diagram of an exemplary implementation of the circuitry of FIG. 1.

Referring to FIG. 2, one exemplary implementation of the circuit 10 of FIG. 1 includes the mixer circuitry 12, the voltage-to-current conversion circuitry 14 and $\Sigma\Delta$ ADC circuitry 16, substantially as shown. The mixer circuitry 12 is implemented with bipolar junction transistors Q1-Q6, resistances R1-R4 and a tail current source 106, interconnected substantially as shown. The two upper differential pairs of transistors Q1-Q4 receive the positive 11$cp$ and negative 11$cn$ phases of the differential clock signal, while the lower differential pair of transistors Q5-Q6 receive the positive 11$ip$ and negative 11$in$ phases of the differential analog input signal 11$i$. These current signals 11$c$, 11$i$ are mixed in accordance with well known principles, with the tail current source 106 providing bias current. The resistances R1-R4 conduct the resulting mixed current signals to produce a differential voltage as the mixed, or product, signal 13. As discussed in more detail below, the collector terminals of the mixer output transistors transistors Q1-Q4 are clamped at virtual ground by a common mode voltage Vcm. The output resistances R1-R4 allow the voltages at the collector terminals of the mixer output transistors transistors Q1-Q4 to increase and decrease according to the charging of integration capacitances C1 in the input stage of the $\Sigma\Delta$ ADC circuitry 16 (discussed in more detail below).

This differential voltage signal 13 is converted to a current mode signal 15 by the voltage-to-current conversion circuitry 14 (e.g., with series resistances leading to the input stage of the ADC circuit 16).

The $\Sigma\Delta$ ADC circuitry 16 includes current signal integration circuits implemented with differential input/output amplifiers 110, 112, series resistances R and feedback capacitances C1, C2, interconnected substantially as shown. The current mode input signal 15 is integrated by the first amplifier stage 110, the output signal 111 of which is further integrated by the second stage 112. (To save on power and circuit area, the second integration stage 112 capacitance C2 is generally smaller than the first integration stage 112 capacitance C1.) The positive and negative phases of the resulting differential signal 113 are compared against each other in a clocked comparator 114 clocked by an ADC clock signal 115 to produce the digital output signal 17.

Current sources 118a, 118b, 120a, 120b provide currents I2, I3 that are switchably coupled via controlled switches S2a, S2b, S3a, S3b to the input nodes of the integrators 110, 112. These switches S2a, S2b, S3a, S3b are opened and closed in accordance with the assertion and de-assertion states (e.g., the high and low signal states) of the digital output signal 17 and its inverse 117, with the assertion, or high, signal state closing the switch and the de-assertion, or low, signal state opening the switch.

These switched currents I2, I3 are conducted by NMOS transistors N1, N2, N3, N4, the control, or gate, electrodes of which are controlled by control voltages 133, 135 related to a common mode voltage Vcm 137. These controlled voltages 133, 135 are generated by comparing the voltages 133a, 133b, 135a, 135b at the input nodes of the integrator circuits 110, 112 with the common mode voltage 137 in dual voltage comparator circuits 132, 134.

As a result, the common mode voltage at the output of the mixer 12 is set by the tail current I1. When the two phases 11ip, 11in of the input signal are equal, the two phases 11cp, 11cn of the clock signal are equal and the mixer resistances R1, R2, R3, R4 are equal (e.g., R1=R2=R3=R4=Rmix), the tail current I1 is equally divided among the resistances R1, R2, R3, R4 (I1/4). This makes the voltage at the out put node 13 equal to VDD−I1*Rmix/4. The input NMOS transistors N1, N2, integrator op-amp 110 and integration capacitances C1 will force the input node voltages 133a, 133b to stay at at the common mode voltage Vcm. The voltage-to-current conversion circuit 14 and switched input currents 118a, 118b (conducted via the input NMOS transistors N1, N2) will charge and discharge the integration capacitances C1. Accordingly, the voltage-to-current conversion circuit 14 will need to accommodate a shift from its input common mode voltage of Vdd−I1*Rmix/4 to its output common mode voltage Vcm, or, alternatively, set its input common mode voltage of VDD−I1*Rmix/4 equal to its output common mode voltage Vcm. (Circuitry capable of this is well known in the art.)

Figure 3:
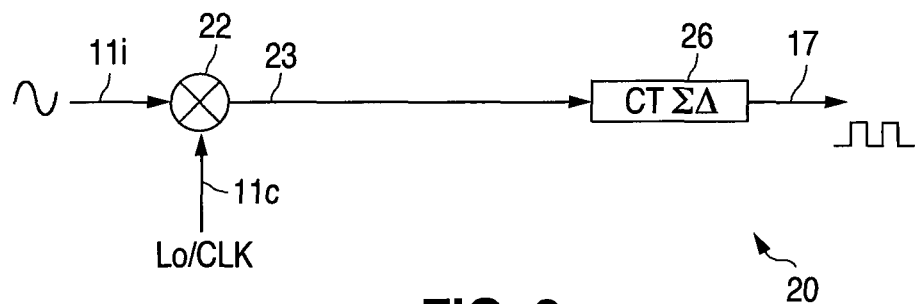
FIG. 3 is a functional blocked diagram of a continuous time $\Sigma\Delta$ ADC circuit implementation in accordance with one embodiment of the presently claimed invention.

Referring to FIG. 3, in accordance with one embodiment of the presently claimed invention, a continuous time ΣΔ ADC circuit is implemented using current mode mixing circuitry 22 and a continuous time ΣΔ ADC circuit 26 having a current mode input stage.

Figure 4:
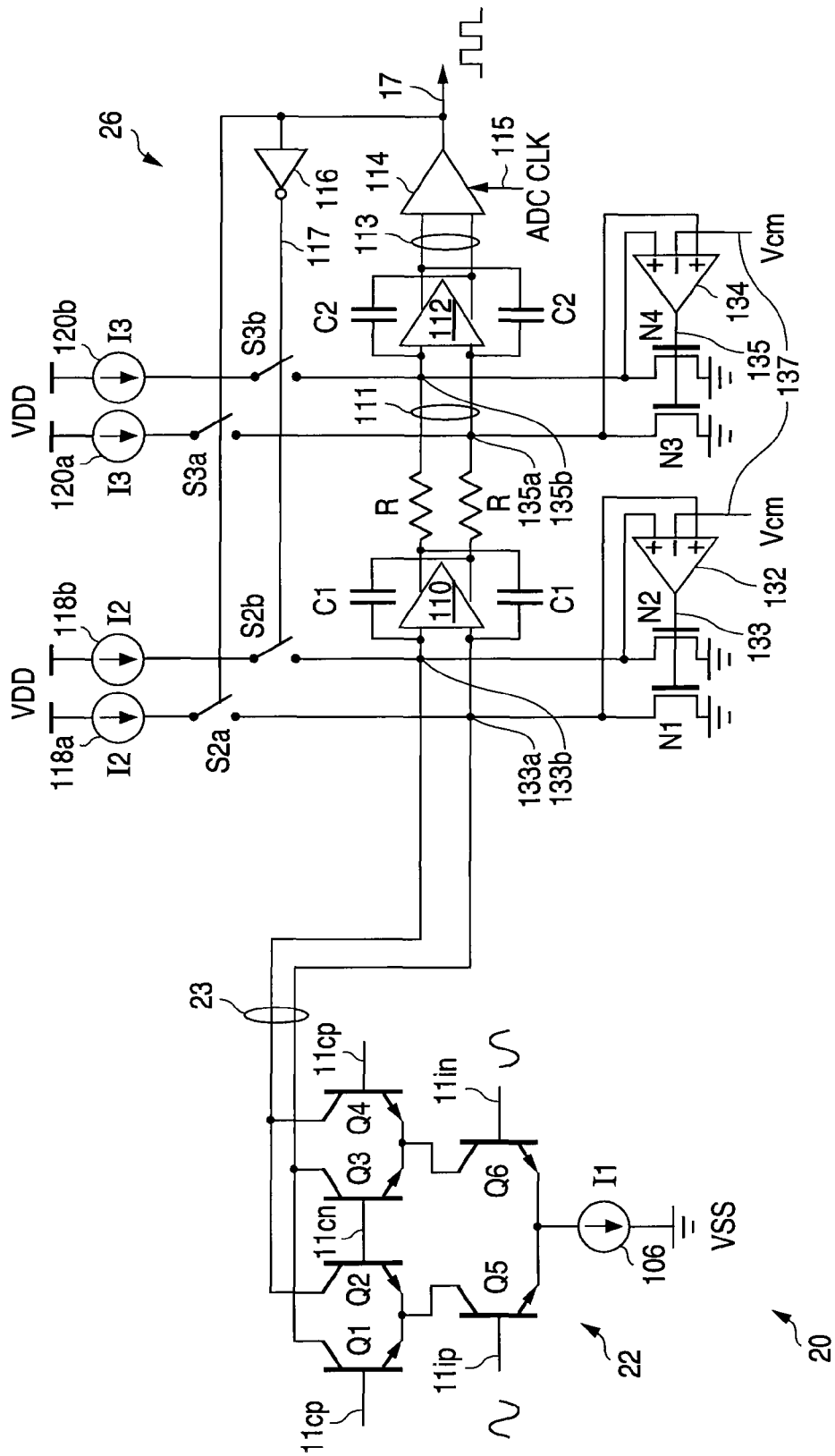
FIG. 4 is a schematic diagram of an exemplary implementation of the circuitry of FIG. 3.

Referring to FIG. 4, in accordance with an exemplary embodiment of the circuitry of FIG. 3, the mixer circuitry 22 is implemented as before, with the exception that the differential output signal 23 is maintained in its current mode form (as the summed collector currents of the output transistors Q1-Q4) and applied directly to the current mode input of the ΣΔ ADC circuitry 26. As a result, the mixer 22 and ADC circuitry 26 operate jointly in a current mode, including the current mode feedback provided by the switched currents I2, I3, in accordance with the digital output signal 17. With such implementation 20, the input mixer circuitry 22 needs only to provide for differential current sinking and no longer needs to also generate a differential voltage signal for later conversion to a voltage mode signal prior to conversion to the desired digital signal.

As a result, the input NMOS transistors N1, N2 integration op-amp 110 and integration capacitances C1 will force the input node voltages 133a, 133b to stay at the common mode voltage Vcm, and the integration capacitances C1 will be charged and discharged by the mixer circuitry 22, switched input currents 118a, 118b and input NMOS transistors N1, N2.

Figure 5:
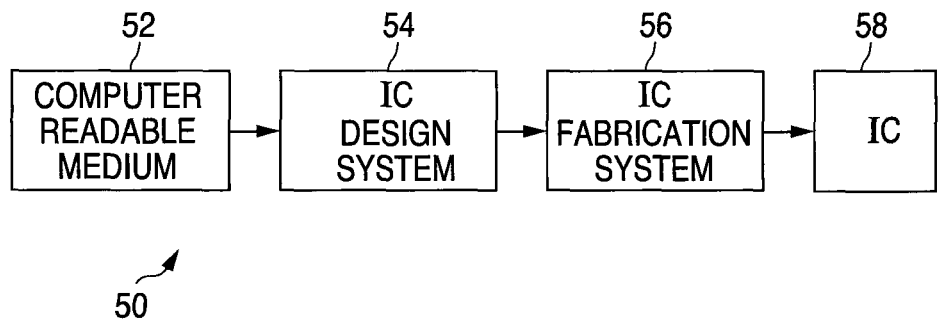
FIG. 5 is a functional block diagram of an exemplary embodiment of an integrated circuit design and fabrication system operated in accordance with computer instructions.

Referring to FIG. 5, integrated circuit (IC) design systems 54 (e.g., work stations or other forms of computers with digital processors) are known that create integrated circuits based on executable instructions stored on a computer readable medium 52, e.g., including memory such as but not limited to CD-ROM, DVD-ROM, other forms of ROM, RAM, hard drives, distributed memory, or any other suitable computer readable medium. The instructions may be represented by any programming language, including without limitation hardware descriptor language (HDL) or other suitable programming languages. The computer readable medium contains the executable instructions (e.g., computer code) that, when executed by the IC design system 54, cause an IC fabrication system 56 to produce an IC 58 that includes the devices or circuitry as set forth herein. Accordingly, the devices or circuits described herein may be produced as ICs 58 by such IC design systems 54 executing such instructions.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including sigma delta (ΣΔ) analog-to-digital conversion (ADC) circuitry, comprising:
   mixing circuitry responsive to an analog input signal and an analog mixing signal by providing a corresponding mixed current signal; and
   ΣΔ ADC circuitry coupled to said mixing circuitry at a signal input, and responsive to said mixed current signal by providing a corresponding digital signal, including
      a power source coupled to said signal input; and
      input signal integration circuitry coupled to said signal input and responsive to said mixed current signal by providing an integration signal;
   said ΣΔ ADC power source supplying power to said mixing circuitry such that said mixing circuitry operates in current sinking mode.

2. The apparatus of claim 1, wherein said mixing circuitry comprises differential mixing circuitry.

3. The apparatus of claim 1, wherein said ΣΔ ADC circuitry further includes:
   signal comparator circuitry coupled to said input signal integration circuitry and responsive to said integration signal by providing said corresponding digital signal.

4. The apparatus of claim 3, wherein:
   said input signal integration circuitry is responsive to said mixed current signal and further responsive to one or more switched current signals by providing said integrated signal; and
   said power source for said ΣΔ ADC circuitry further comprises switched current source circuitry, and responsive to said digital signal by providing said one or more switched current signals.

5. A method of performing sigma delta (ΣΔ) analog-to-digital signal conversion of a mixed signal employable with an analog signal mixer and a sigma delta (ΣΔ) analog-to-digital converter (ADC) including input signal integration circuitry, comprising:
   mixing an analog input signal and an analog mixing signal to provide a corresponding mixed current signal;

configuring said ΣΔ ADC to supply power to said analog signal mixer such that said analog signal mixer operates in current sinking mode;

integrating said mixed current signal and providing an integration signal; and performing ΣΔ analog-to-digital signal conversion of said mixed current signal using said integration signal to provide a corresponding digital signal.

6. The method of claim 5, wherein said mixing an analog input signal and an analog mixing signal comprises mixing a plurality of differential analog input and analog mixing signals to provide a corresponding differential mixed current signal.

7. The method of claim 5, wherein said performing ΣΔ analog-to-digital signal conversion of said mixed current signal to provide a corresponding digital signal comprises:

differentially integrating said mixed current signal to provide a differential integrated signal with opposing signal phases; and mutually comparing said opposing signal phases to provide said corresponding digital signal.

8. The method of claim 5, wherein said performing ΣΔ analog-to-digital signal conversion of said mixed current signal to provide a corresponding digital signal comprises:

differentially integrating said mixed current signal and one or more switched current signals to provide a differential integrated signal with opposing signal phases;

mutually comparing said opposing signal phases to provide said corresponding digital signal; and switching one or more currents in response to said digital signal to provide said one or more switched current signals.

9. The apparatus of claim 1, wherein said ΣΔ ADC circuitry comprises continuous time ΣΔ ADC circuitry.

10. The apparatus of claim 1, wherein said mixing signal comprises one of a carrier signal and a clock signal.

11. The method of claim 5, wherein said ΣΔ ADC circuitry comprises continuous time ΣΔ ADC circuitry.

12. The method of claim 5, wherein said mixing signal comprises one of a carrier signal and a clock signal.

13. An analog-to-digital conversion circuit operable with an analog signal mixer, comprising an analog signal mixer configured to receive an analog input signal and an analog mixing signal, and provide a corresponding mixed current signal; and sigma delta (ΣΔ) analog-to-digital conversion (ADC) circuitry coupled to the analog signal mixer at a signal input, and configured to convert the mixed current signal into a corresponding digital signal, including input signal integration circuitry configured to receive the mixed current signal at the signal input, and provide an integration signal;

switched current source circuitry coupled to the signal input, and responsive to the digital signal by providing one or more switched current signals;

the ΣΔ ADC responsive to the integration signal and the switched current signals to supply the digital signal;

the switched current source circuitry supplying power to the analog signal mixer such that the signal mixer operates in current sinking mode.

14. The circuit of claim 13, wherein the analog signal mixer comprises a differential analog signal mixer.

15. The circuit of claim 13, wherein said ΣΔ ADC circuitry further includes:

signal comparator circuitry coupled to the input signal integration circuitry, and responsive to the integration signal by providing the digital signal.

16. The circuit of claim 13, wherein said ΣΔ ADC circuitry comprises continuous time ΣΔ ADC circuitry.

17. The apparatus of claim 13, wherein said analog mixing signal comprises one of a carrier signal and a clock signal.

* * * * *